(12) United States Patent
Woods et al.

(10) Patent No.: US 7,087,304 B1
(45) Date of Patent: Aug. 8, 2006

(54) POLYSULFIDE-BASED TOUGHENING AGENTS, COMPOSITIONS CONTAINING SAME AND METHODS FOR THE USE THEREOF

(75) Inventors: John G. Woods, Farmington, CT (US); Yuhshi Luh, Orange, CT (US); Mark M. Konarski, Old Saybrook, CT (US)

(73) Assignee: Henkel Corporation, Rock Hill, CT (US)

( * ) Notice: Subject to any disclaimer, the term of this patent is extended or adjusted under 35 U.S.C. 154(b) by 332 days.

(21) Appl. No.: 10/367,759

(22) Filed: Feb. 19, 2003

(51) Int. Cl.
*B32B 27/38* (2006.01)
*B32B 7/12* (2006.01)
*C08L 63/00* (2006.01)
*C09J 163/00* (2006.01)
*H01L 21/56* (2006.01)

(52) U.S. Cl. ............... 428/414; 156/330; 428/413; 438/127; 523/400; 523/435; 525/525; 525/535

(58) Field of Classification Search .......... 523/400, 523/435; 525/525, 535; 428/413, 414; 156/330
See application file for complete search history.

(56) References Cited

U.S. PATENT DOCUMENTS

| 4,017,554 A | * | 4/1977 | Villa ......................... 528/375 |
| 4,692,500 A | * | 9/1987 | Hefner, Jr. ................. 525/529 |
| 5,447,988 A | | 9/1995 | Dershem et al. ........... 524/780 |

FOREIGN PATENT DOCUMENTS

JP          03-081374      * 4/1991

OTHER PUBLICATIONS

English Abstract of JP 03-081374, provided by the JPO website.*
"Thiokol LP-3" Construction Adhesives, Adhesives and Sealants, Rohm and Haas, Jan., 2001.
"Thioplast", AKCROS Chemicals, Manchester, Great Britain, undated.

* cited by examiner

*Primary Examiner*—Michael J. Feely
(74) *Attorney, Agent, or Firm*—Steven C. Bauman

(57) ABSTRACT

In accordance with the present invention, there are provided toughening agents which are useful for improving the performance properties of epoxy-based adhesive formulations. For example, epoxidized polysulfides have been found to be useful toughening agents of component level underfill adhesive compositions. Invention materials are liquid rubbers which provide improved fracture toughness while maintaining satisfactory capillary flow properties. Invention materials can be synthesized in neat (solventless) reactions from readily available low-cost raw materials and isolated in high yields. They have linear and branched telechelic structures with terminal epoxide functional groups, and are prepared without substantially increasing the molecular weight of the starting polysulfide materials. Invention materials are compatible with common epoxy formulations and may be used without purification. At low levels of incorporation, they provide adhesives that meet the minimum fracture toughness (Gq>2.0 lb/in) and capillary flow specifications (flow time<180 seconds) for many commercial underfill applications. In accordance with a further embodiment of the present invention, there are provided adhesive compositions comprising invention compounds and methods for use thereof. In additional embodiments of the present invention, there are provided methods for the preparation of invention toughening agents, methods for adhesively attaching a device to a substrate, and assemblies comprising first article(s) adhered to second article(s).

13 Claims, 2 Drawing Sheets

POLYSULFIDE-BASED TOUGHENING AGENTS, COMPOSITIONS CONTAINING SAME AND METHODS FOR THE USE THEREOF

FIELD OF THE INVENTION

The present invention relates to compounds and formulations useful for improving the toughness of adhesive compositions and methods for use thereof. In a particular aspect, the present invention relates to epoxy-based resin formulations having improved fracture toughness. In another aspect, the present invention relates to methods for improving the fracture toughness of epoxy-based resin formulations. In still another aspect, the present invention relates to methods for preparing toughening agents useful for improving the fracture toughness of epoxy-based resin formulations.

BACKGROUND OF THE INVENTION

Toughness is the ability of a material to absorb energy and undergo large permanent set without rupture. For many engineering adhesive applications, toughness is often the deciding factor. Plastics, because of their inherent brittleness, have been modified in a variety of ways in efforts to improve the toughness thereof. Epoxy resins, for example, which form a versatile glassy network, exhibit excellent resistance to corrosion and solvents, good adhesion, reasonably high glass transition temperatures ($T_g$) and adequate electrical properties. Unfortunately, however, the poor fracture toughness of epoxy resins oftentimes limits the usefulness thereof.

The impact strength as well as most other physical properties of crosslinked epoxy resins is controlled by the chemical structure and ratio of the epoxy resin and hardener, by any added fillers, and by the curing conditions used. Unfortunately, crosslinked, glassy epoxy resins with relatively high $T_g$(>100° C.) are brittle. The poor impact strength of high glass transition epoxy resins limits the usage of epoxies as structural materials and in composites.

Indeed, current commercially available underfill epoxy adhesives are excessively brittle and tend to fail prematurely in such applications as chip scale packaging (CSP) and related applications as a result of poor fracture toughness. Conventional toughening agents (e.g. carboxyl terminated butadiene, i.e., CTBN) are frequently unsuitable as additives in these adhesives because they adversely affect the capillary flow properties of the uncured adhesive.

Polysulfide-based toughening agents are known. For instance, polysulfide-based toughening agents of the general formulae:

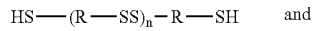

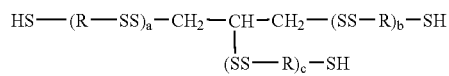

where R is an alkyl ether (such as —($CH_2$)$_2$—O—$CH_2$—O—($CH_2$)$_2$—) and a+b+c=n (where n is 6) and having about 2 mole percent branching, are known as THIOKOL LP-3, available commercially from Rohm and Haas Company, Philadelphia, Pa. LP-3 is reported to have a molecular weight of about 1,000.

In addition to the above-described commercially available materials, Akcros Chemicals (Manchester, Great Britain) also makes polysulfide-based toughening agents, which are available commercially under the tradename THIOPLAST, including products referred to as G1 (n is 19–21, 1.8–2 percent thiol content, and a 3,300–3,700 molecular weight), G4 (n is less than 7, less than 5.9 percent thiol content, and less than 1,100 molecular weight), G12 (n is 23–26, 1.5–1.7 percent thiol content, and a 3,900–4,400 molecular weight), G21 (n is 12–15, 2.5–3.1 percent thiol content, and a 2,100–2,600 molecular weight), G22 (n is 14–18, 2.1–2.7 percent thiol content, and a 2,400–3,100 molecular weight), G112 (n is 23–25, 1.5–1.7 percent thiol content, and a 3,900–4,300 molecular weight), and G131 (n is 30–38, 1.5–1.7 percent thiol content, and a 5,000–6,500 molecular weight). The THIOPLAST polysulfide-based toughening agents are reported to be prepared from the polycondensation of bis-(2-chloro-ethyl) formal with alkali polysulfide.

However, previously described polysulfide-based toughening agents are not useful in applications where good capillary flow is required, e.g., in underfill adhesive applications. Accordingly, there is a need for toughening agents that are effective for improving the toughness of adhesive formulations, especially in formulations requiring good capillary flow properties.

SUMMARY OF THE INVENTION

In accordance with the present invention, there are provided toughening agents which are useful for improving the performance properties of epoxy-based adhesive formulations. For example, epoxidized polysulfides have been found to be useful toughening agents of component level underfill adhesive compositions. Invention materials are liquid rubbers which provide improved fracture toughness while providing excellent capillary flow properties. Invention materials can be synthesized in neat (solventless) reactions from readily available low-cost raw materials and isolated in high yields. They have linear and branched structures with terminal epoxide functional groups, and are prepared without substantially increasing the molecular weight of the starting polysulfide material. Invention materials are compatible with common epoxy formulations and may be used without purification. At low levels of incorporation, they provide adhesives that meet the minimum fracture toughness (Gq>2.0 lb/in) and capillary flow specifications (i.e., flow, by capillary force, a distance of 20 mm through a 2-mil gap between a pair of microscope slides in <180 seconds at 120° C.) for many commercial underfill applications.

In accordance with a further embodiment of the present invention, there are provided adhesive compositions comprising invention compounds and methods for use thereof.

In additional embodiments of the present invention, there are provided methods for the preparation of invention toughening agents, methods for adhesively attaching a device to a substrate, and assemblies comprising first article(s) adhered to second article(s).

DETAILED DESCRIPTION OF THE INVENTION

Figure 1:
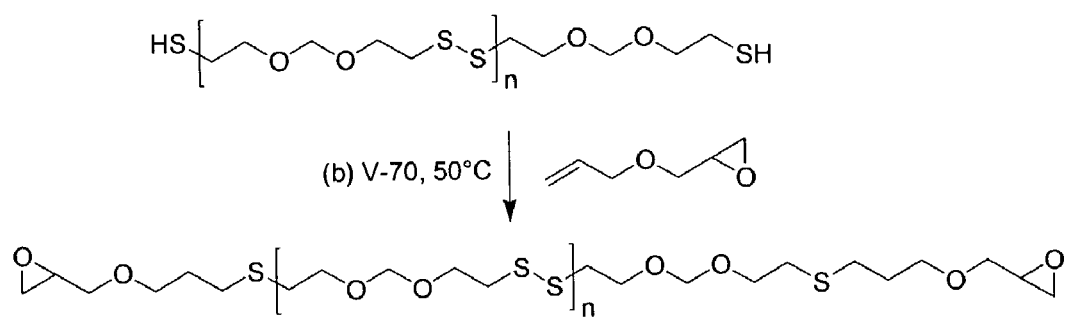
FIG. 1 illustrates the synthesis of an epoxidized polysulfide of the invention by radical addition of allyl glycidyl ether (AGE) to thiol-terminated polysulfide.

In accordance with the present invention, there are provided methods for preparing epoxidized polysulfide liquid rubbers, the methods comprising subjecting a mixture of a thiol-terminated polysulfide liquid rubber, an alkenyl- or alkynyl-functional epoxy monomer, and a free radical catalyst to a temperature of no greater than about 60° C. for a time in the range of about 1 up to about 24 hours.

Thus, invention toughening agents can be readily prepared by combining a thiol-terminated polysulfide liquid rubber and an alkenyl- or alkynyl-functional epoxy monomer in substantially stoichiometric amounts, although the ratio of thiol groups of the thiol-terminated polysulfide liquid rubber to the alkenyl or alkynyl groups of the alkenyl- or alkynyl-functional epoxy monomer can vary from about 0.8:1 up to about 1.2:1. Any excess reagent which remains after completion of the invention epoxidation reaction can optionally be removed when the reaction is complete, or can be retained as part of the reaction mixture and added directly to the epoxy resin to be modified.

Thiol-terminated polysulfide liquid rubbers contemplated for use in the practice of the present invention typically have a thiol equivalent weight in the range of about 200 up to about 6,000 (with a thiol equivalent weight in the range of about 300 up to about 3000 being presently preferred), a viscosity at 25° C. in the range of about 300 up to about 30,000 milliPascal-seconds (mPa·s; 1 milliPascal-second=1 centipoise; viscosities in the range of about 500 up to about 10,000 mPa·s are presently preferred), and a molecular weight in the range of about 400 up to about 12,000 (with a molecular weight in the range of about 500 up to about 5000 being presently preferred).

Invention toughening agents can be prepared from a variety of thiol-terminated liquid rubbers, typically having the structure:

$$HS-(RSS)_n-R-SH$$

wherein:
each R is independently alkylene or substituted alkylene, oxyalkylene or substituted oxyalkylene, or thiaalkylene or substituted thiaalkylene, and
n is at least about 4 up to about 30, such that the resulting polymer has a molecular weight in the range of about 400 up to about 12,000.

R, on average, has a backbone greater than 6 atoms in length. Exemplary R's include such bivalent species as $-(CH_2)_7-$, $-(CH_2)_{10}-$, $-(CH_2)_4-O-(CH_2)_4-$, $-(CH_2)_2-O-CH_2-O-(CH_2)_2-$, $-(CH_2)_4-O-CH_2-O-(CH_2)_4-$, and the like. A presently preferred R is $-(CH_2)_2-O-CH_2-O-(CH_2)_2-$.

Synthesis of thiol-terminated polysulfide liquid rubbers is well known in the art. For example, such materials can be obtained by the polycondensation of bis-(2-chloroethyl) formal with alkali polysulfide, followed by degradation of the resulting polymer in the presence of base under conditions suitable to produce the thiol-terminated polysulfide liquid rubber.

Epoxy monomers contemplated for use in the practice of the present invention include alkenyl- or alkynyl-functional epoxy monomers comprising the structure:

$$E_x\text{-L-F},$$

wherein:
E is an epoxy-containing radical,
L is a covalent bond or a di- or tri-valent linker,
F is a unit of ethylenic or acetylenic unsaturation, provided, however, that F does not undergo significant homopolymerization under the conditions employed for the preparation of the epoxidized polysulfide, and
x is 1 or 2.

While it is presently preferred that alkenyl- or alkynyl-functional epoxy monomers contemplated for use in the practice of the present invention react substantially exclusively with the thiol-terminated polysulfide liquid rubber, it is within the scope of the present invention that a small portion (typically less than about 10%) of the units of ethylenic or acetylenic unsaturation may undergo homopolymerization. In other words, alkenyl- or alkynyl-functional epoxy monomers contemplated for use in the practice of the present invention have a substantial preference for reaction with thiol-terminated polysulfide liquid rubber, relative to the propensity of such reactants to homopolymerize.

Exemplary epoxy-containing radicals, E, include epoxy, epoxycyclohexyl, epoxymethylcyclohexyl, epoxynorbornyl, and the like, as well as mixtures of any two or more thereof.

As readily recognized by those of skill in the art, L can be any of a variety of linking species, for example, L can be any of the following structures:

$$-Z-, -W-, -Z-W-, -W-Z-, -W-Z-W-,$$

and combinations of any 2 or more thereof,
wherein:
each Z is independently alkylene, substituted alkylene, cycloalkylene, substituted cycloalkylene, heterocyclic, substituted heterocyclic, oxyalkylene, substituted oxyalkylene, alkenylene, substituted alkenylene, arylene, substituted arylene, alkarylene, substituted alkarylene, aralkylene or substituted aralkylene, and
each W is independently ester, reverse ester, thioester, reverse thioester, amide, reverse amide, silyl, carbonate, or carbamate.

Presently preferred linkers, L, include a covalent bond, $-CH_2-O-$, $-CH_2-O-CH_2-$, $-(CH_2)_6-$, $-CH_2-O-(CH_2)_2-O-$ or $-CH_2-O-C_6H_4-CH_2-$. The presently most preferred linker, L, contemplated for use herein is $-CH_2-O-CH_2-$.

As employed herein, "alkyl" refers to hydrocarbyl radicals having 1 up to about 20 carbon atoms, preferably 2–10 carbon atoms; and "substituted alkyl" comprises alkyl groups further bearing one or more substituents selected from alkoxy, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amido, C(O)H, acyl, oxyacyl, carboxyl, carbamate, sulfonyl, sulfonamide, sulfuryl, and the like.

As employed herein, "cycloalkyl" refers to cyclic ring-containing groups containing in the range of 3 up to about 8 carbon atoms, and "substituted cycloalkyl" refers to cycloalkyl groups further bearing one or more substituents as set forth above.

As employed herein, "alkenyl" refers to straight or branched chain hydrocarbyl groups having at least one unit of ethylenic unsaturation, i.e., a carbon—carbon double bond, and having in the range of 2 up to about 12 carbon atoms, and "substituted alkenyl" refers to alkenyl groups further bearing one or more substituents as set forth above.

As employed herein, "unit of ethylenic unsaturation" refers to unsaturation comprising localized (i.e., non-aromatic) carbon—carbon double bonds, as shown below:

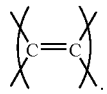

As employed herein, "unit of acetylenic unsaturation" refers to unsaturation comprising localized (i.e., non-aromatic) carbon—carbon triple bonds, as shown below:

As employed herein, "cycloalkenyl" refers to cyclic ring-containing groups containing in the range of 3 up to about 8 carbon atoms, wherein the cyclic ring-containing group contains at least one carbon—carbon double bond. "Substituted cycloalkenyl" refers to cycloalkenyl groups further bearing one or more substituents as set forth above. Cycloalkenyl groups as defined herein also refer to bicycloalkenyl groups, such as, for example, 2.2.1.-bicycloheptene, and the like.

As employed herein, "aryl" refers to aromatic groups having in the range of 6 up to about 14 carbon atoms and "substituted aryl" refers to aryl groups further bearing one or more substituents as set forth above.

As employed herein, "alkylene" refers to divalent hydrocarbyl radicals having 1 up to about 20 carbon atoms, preferably 2–10 carbon atoms; and "substituted alkylene" comprises alkylene groups further bearing one or more substituents as set forth above.

As employed herein, "cycloalkylene" refers to divalent cyclic ring-containing groups containing in the range of 3 up to about 8 carbon atoms, and "substituted cycloalkylene" refers to cycloalkylene groups further bearing one or more substituents as set forth above.

As employed herein, "alkenylene" refers to divalent, straight or branched chain hydrocarbyl groups having at least one carbon—carbon double bond, and having in the range of 2 up to about 12 carbon atoms, and "substituted alkenylene" refers to alkenylene groups further bearing one or more substituents as set forth above.

As employed herein, "arylene" refers to divalent aromatic groups having in the range of 6 up to about 14 carbon atoms and "substituted arylene" refers to arylene groups further bearing one or more substituents as set forth above.

As employed herein, "alkarylene" refers to an arylene group bearing an alkyl substituent and "substituted alkarylene" refers to alkarylene groups further bearing one or more substituents as set forth above.

As employed herein, "aralkylene" refers to an alkylene group bearing an aryl substituent and "substituted aralkylene" refers to aralkylene groups further bearing one or more substituents as set forth above.

As employed herein, "oxyalkylene" refers to the moiety —O-alkylene-, wherein alkylene is as defined above, and "substituted oxyalkylene" refers to oxyalkylene groups further bearing one or more substituents as set forth above.

As employed herein, "heterocyclic" refers to cyclic (i.e. ring containing) groups containing one or more heteroatoms (e.g. N, O, S, or the like) as part of the ring structure, and having in the range of 3 up to 20 carbon atoms, and "substituted heterocyclic" refers to heterocyclic groups further bearing one or more substituents as set forth above.

The resulting toughening agents have the structure:

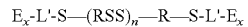

wherein:
each R is independently alkylene or substituted alkylene, oxyalkylene or substituted oxyalkylene, or thiaalkylene or substituted thiaalkylene, E is an epoxy-containing radical, L' is a covalent bond, or a low molecular weight di- or tri-valent linker (the backbone thereof typically having in the range of 2 up to about 20 atoms), n is at least about 4 up to about 30, such that the resulting polymer has a molecular weight in the range of about 400 up to about 12,000, and each x is independently 1 or 2.

Epoxidized polysulfide liquid rubbers according to the present invention typically have an epoxy equivalent weight in the range of about 300 up to about 7000, and a viscosity at 25° C. in the range of about 300 up to about 30,000 mPa·s (with viscosities in the range of about 400–10,000 mPa·s being preferred, and viscosities in the range of about 500–2000 mPa·s being especially preferred), wherein the polysulfide from which the epoxidized polysulfide liquid rubber is derived has a molecular weight in the range of about 800 up to about 7000.

In accordance with another embodiment of the present invention, invention toughening agents further comprise unreacted multi-functional epoxy monomer. Thus, as little as a few percent by weight of the unreacted epoxy monomer may be present as part of the invention toughening agent, with as much as 50 percent by weight, or more, of the invention toughening agent comprising unreacted epoxy monomer from which the epoxy-extended polyacrylate is prepared.

In accordance with still another embodiment of the present invention, there are provided methods to improve the fracture toughness of an epoxy-based adhesive composition, the methods comprising adding to the adhesive composition an effective amount of an invention toughening agent. As little as about 2 weight percent invention toughening agent, up to about 25 weight percent invention toughening agent can be employed in the practice of the present invention.

In accordance with yet another embodiment of the present invention, there are provided adhesive formulations comprising:

a curable epoxy resin, a curing agent, at least one toughening agent according to the invention; and optionally, a filler.

In another aspect of the present invention, the performance properties (e.g., toughness) of underfill sealant compositions is improved by adding invention toughening agents thereto. Such formulations typically comprise an epoxy resin component, a secondary amine-based curing agent, a curative based on the combination of a nitrogen containing compound and a transition metal complex, and an adhesion promoting component. Reaction products of these compositions demonstrate improved adhesion, improved resistance to moisture absorption, and improved resistance to stress cracking.

Typically, the composition includes about 60 to about 95.8 weight percent of the epoxy resin component (which includes up to about 10 weight percent of invention toughening agent), about 5 to about 30 weight percent of the secondary amine-based curing agent, about 0.2 to about 10 weight percent of the curative, of which about 99.8 to about 99.98 weight percent is comprised of the nitrogen containing compound and about 0.02 to about 0.2 weight percent is comprised of the transition metal complex, and about 0.1 up to about 10 weight percent of the adhesion promoting component.

The epoxy resin component of the present invention may include any common epoxy resin, which may have at least one multifunctional epoxy resin.

Examples of such epoxy resins include C4–C28 alkyl glycidyl ethers; C2–C28 alkyl- and alkenyl-glycidyl esters; C1–C28 alkyl-, mono- and poly-phenol glycidyl ethers; polyglycidyl ethers of pyrocatechol, resorcinol, hydroquinone, 4,4'-dihydroxydiphenyl methane (or bisphenol F, such as RE-404-S or RE-410-S available commercially from Nippon Kayuku, Japan), 4,4'-dihydroxy-3,3'-dimethyldiphenyl methane, 4,4'-dihydroxydiphenyl dimethyl methane (or bisphenol A), 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphenyl)methane; polyglycidyl ethers of transition metal complex chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N,N'-diglycidyl-4-aminophenyl glycidyl ether; N,N,N',N'-tetraglycidyl-1,3-propylene bis-4-aminobenzoate; phenol novolac epoxy resin; cresol novolac epoxy resin; and combinations thereof.

Among the commercially available epoxy resins suitable for use herein are polyglycidyl derivatives of phenolic compounds, such as those available under the tradenames EPON 828, EPON 1001, EPON 1009, and EPON 1031, from Shell Chemical Co.; DER 331, DER 332, DER 334, and DER 542 from Dow Chemical Co.; GY285 from Ciba Specialty Chemicals, Tarrytown, N.Y.; and BREN-S from Nippon Kayuku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company. Cresol analogs are also available commercially ECN 1235, ECN 1273, and ECN 1299 from Ciba Specialty Chemicals. SU-8 is a bisphenol A-type epoxy novolac available from Shell Chemicals (formerly, Interez, Inc.). Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE MY-721, ARALDITE 0500, and ARALDITE 0510 from Ciba Specialty Chemicals and PGA-X and PGA-C from the Sherwin-Williams Co. And of course combinations of the different epoxy resins are also desirable for use herein.

As noted above, the epoxy resin component of the present invention may include any common epoxy resin, at least a portion of which is a multifunctional epoxy resin. Ordinarily, the multifunctional epoxy resin should be included in amount within the range of about 20 weight percent to about 100 weight percent of the epoxy resin component.

A monofunctional epoxy resin, if present, should ordinarily be used as a reactive diluent, or crosslink density modifier. In the event such a monofunctional epoxy resin is included as a portion of the epoxy resin component, such resin should be employed in an amount of up to about 20 weight percent, based on the total epoxy resin component.

In choosing epoxy resins for the epoxy resin component of the compositions of the present invention, consideration should also be given to viscosity and other properties thereof.

Additional polymerizable co-reactants contemplated for optional use in the practice of the present invention include, for example maleimides, nadimides, itaconamides, cyanate esters, vinyl ethers, acrylates, styrenes, and the like.

The secondary amine-based curing agent should have at least two secondary amines available for reaction. For instance, the secondary amine-based curing agent may be represented as within the following structure I:

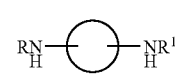

where R and $R^1$ may be the same or different and may be selected from $C_{1-12}$ alkyl, $C_{1-12}$ alkenyl, $C_{5-12}$ cyclo or bicycloalkyl, $C_{6-18}$ aryl, and derivatives thereof, and $\bigcirc$ may be selected from $C_{1-12}$ alkylene, $C_{1-12}$ alkenylene, $C_{5-12}$ cyclo or bicycloalkylene, $C_{5-12}$ cyclo or bicycloalkenylene, $C_{6-18}$ arylene, and derivatives thereof.

The secondary amine-based curing agent should be used in the inventive compositions in an amount within the range of about 5 to about 30 weight percent, with about 13 to about 20 weight percent being particularly desirable, depending of course on the identity of the chosen secondary amine-based curing agent.

As employed herein, the term "curing agents" refers to polymerization promoters, co-curing agents, catalysts, initiators or other additives designed to participate in or promote curing of the adhesive formulation. With respect to epoxide-based adhesive formulations, such curing agents include polymerization promoters and catalysts such as, for example, anhydrides, amines, imidazoles, amides, thiols, carboxylic acids, phenols, dicyandiamide, urea, hydrazine, hydrazide, amino-formaldehyde resins, melamine-formaldehyde resins, amine-boron trihalide complexes, quaternary ammonium salts, quaternary phosphonium salts, tri-aryl sulfonium salts, di-aryl iodonium salts, diazonium salts, and the like, as well as combinations of any two or more thereof, optionally also including a transition metal complex. Presently preferred curing agents and catalysts for epoxide-based formulations include anhydrides, amines, imidazoles, and the like.

Transition metal complexes contemplated for use herein may be chosen from a variety of organometallic materials or metallocenes as can be readily identified by those of skill in the art.

As readily recognized by those of skill in the art, curing agents contemplated for use in the practice of the present invention will vary with the reactive functionality(ies) present, the presence of optional co-reactant(s), and the like. Typically, the quantity of curing agent will fall in the range of about 1 weight % up to about 50 weight % of the total composition, with presently preferred amounts of curing agent falling in the range of about 5 weight % up to about 40 weight % of the total composition.

Initiators contemplated for use with epoxide-based adhesive formulations include hydroxy functionalized compounds such as, for example, alkylene glycols. Preferred alkylene glycols include ethylene glycols and propylene glycols.

Fillers contemplated for optional use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the adhesive compositions of the present invention. Preferably, the flake has a thickness of less than about 2 microns, with planar dimensions of about 20 to about 25 microns. Flake employed herein preferably has a surface area of about 0.15 to 5.0 $m^2/g$ and a tap density of about 0.4 up to about 5.5 g/cc. It is presently preferred that powder employed in the practice of the invention has a diameter of about 0.5 to 15 microns. If present, the filler typically comprises in the range of about 30% up to about 70% by weight of the adhesive formulation.

Thermally conductive fillers contemplated for optional use in the practice of the present invention include, for example, aluminum nitride, boron nitride, silicon carbide, diamond, graphite, beryllium oxide, magnesia, silica, alumina, and the like. Preferably, the particle size of these fillers will be about 20 microns. If aluminum nitride is used as a filler, it is preferred that it be passivated via an adherent, conformal coating (e.g., silica, or the like).

Electrically and/or thermally conductive fillers are optionally (and preferably) rendered substantially free of catalytically active metal ions by treatment with chelating agents, reducing agents, nonionic lubricating agents, or mixtures of such agents. Such treatment is described in U.S. Pat. No. 5,447,988, which is incorporated by reference herein in its entirety.

Optionally, a filler may be used that is neither an electrical nor thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fumed silica, fused silica, glass powder, and the like.

Flexibilizers (also called plasticizers) contemplated for optional use in the practice of the present invention include branched polyalkanes or polysiloxanes that lower the $T_g$ of the formulation. Such flexibilizers include, for example, polyethers, polyesters, polythiols, polysulfides, and the like. If used, flexibilizers typically are present in the range of about 0.5% up to about 30% by weight of the formulation.

Dyes contemplated for optional use in the practice of the present invention include nigrosine, Orasol blue GN, phthalocyanines, and the like. When used, organic dyes in relatively low amounts (i.e., amounts less than about 0.2% by weight) provide contrast.

Pigments contemplated for optional use in the practice of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 up to about 5 weight %, relative to the weight of the base formulation.

In accordance with another embodiment of the present invention, there are provided methods for adhesively attaching a device to a substrate, such methods comprising dispensing an invention adhesive formulation onto a substrate and/or a device or between the substrate and the device to form an assembly, and exposing the assembly to conditions sufficient to cure the adhesive.

Conditions suitable to cure invention adhesive formulations comprise subjecting invention adhesive formulations to a temperature of at least about 120° C. but less than about 190° C. for about 0.5 up to about 60 minutes. This rapid, short duration heating can be accomplished in a variety of ways, e.g., with an in-line heated rail, a belt furnace, a curing oven, or the like.

In accordance with yet another embodiment of the present invention, there are provided assemblies produced by the above-described methods.

In accordance with a further embodiment of the present invention, there are provided methods for adhesively attaching a first article to a second article, such methods comprising:

(a) applying an invention formulation to the first article, (b) bringing the first and second article into intimate contact to form an assembly wherein the first article and the second article are separated only by the adhesive composition applied in step (a), and thereafter, (c) subjecting the assembly to conditions suitable to cure the adhesive formulation.

In accordance with yet another embodiment of the present invention, there are provided assemblies produced by the above-described methods.

In accordance with a still further embodiment of the present invention, there are provided methods for encapsulating electronic components, such methods comprising:

applying an invention formulation to the component, and curing the formulation.

In accordance with yet another embodiment of the present invention, there are provided assemblies produced by the above-described methods.

In accordance with a still further embodiment of the present invention, there are provided methods for encapsulating electronic components, such methods comprising curing a formulation according to the invention after application of the formulation to the component.

In accordance with yet another embodiment of the present invention, there are provided articles produced by the above-described methods.

In accordance with a still further embodiment of the present invention, there are provided articles comprising an electronic component adhesively attached to a circuit board, wherein the electronic component is adhesively attached to the board by a cured aliquot of invention formulation.

Those of skill in the art recognize that many different electronic packages would benefit from preparation using the invention formulations described herein. Examples of such packages include ball grid arrays, super ball grid arrays, IC memory cards, chip carriers, hybrid circuits, chip-on-board, multi-chip modules, pin grid arrays, CSPs, and the like.

The invention will now be described in greater detail by reference to the following nonlimiting examples.

EXAMPLES

Materials:

All starting materials and solvents were purchased from the Aldrich Chemical Company, and were used without further purification, unless otherwise specified.

Thioplast G4 polysulfide was supplied by Akcros Chemicals. Azonitrile initiators V-70 and V-65 were purchased from Wako Chemicals Inc., Vazo 64 was supplied by DuPont.

Chemical Analyses:

Proton Nuclear Magnetic Resonance analyses (1H NMR) were performed on a Varian 300 Hz Gemini Spectrophotometer. Infrared spectra (IR) were recorded on a Perkin-Elmer Spectrum One FTIR Spectrophotometer. Epoxy equivalent weight (EEW) measurements were performed according to standard titrometric methodology, using a 0.15 g sample and 0.1 N $HClO_4$/HOAc titrant. Thiol equivalent weights (TEW) were determined by potentiometric titration on a Brinkman 62 autotitrator with combination Pt ring electrode. The thiol content was analyzed by reaction with excess iodine, followed by back titration with standard sodium thiosulfate.

Physical and Materials Testing:

Viscosity measurements were performed on a Brookfield Model DV-111 Programmable Rheometer at 25° C. Capillary flow measurements were performed by allowing material to flow 20 mm at 120° C. through a 2-mil gap between a pair of microscope slides. Fracture toughness testing was carried out according to ASTM D5045-99 (area method) employing samples that were 3 mm thick. The critical energy release rate (Gq) and stress intensity factor (Kq) were determined in an Instron mechanical tester at a loading rate of 10 mm/minute using three-point bend geometry and a crack induced from a single edge cut notch (2.5 mm). Specimens for fracture toughness measurements were prepared as follows: a pair of glass plates (20.5×12.5×0.4 $cm^3$) was treated with release agent and heated at 121° C. for one hour. The treated plates were assembled into an open-topped mold by means of a U-shaped Teflon gasket/spacer (3.0 mm in thickness) and held together by means of external clamps. The mold was filled with the adhesive formulation and heated to 90° C. under reduced pressure to remove all air bubbles (10–30 minutes). The adhesive was then cured in situ by heating at 100° C. for 1 hour and 140° C. for 2 hours. The cured product was removed from the mold, cut into test coupons (12.5 mm×63.5 mm) which were edge-sanded and measured.

Example 1

Synthesis of Epoxidized Polysulfide by Radical Addition of AGE

The subject reaction was conducted neat using stoichiometric amounts of AGE and polysulfide, a typical synthesis procedure using polysulfide G4 is as follows. To a 250 mL three-neck round bottom flask fitted with magnetic stirrer and nitrogen inlet, was added allylglycidyl ether (AGE; 22.280 g; 0.2 equivalents of epoxide) and Thioplast G4 polysulfide (90.958 g; 0.2 equivalents of thiol). The mixture was stirred to give a homogeneous solution, then 2,2'-azobis (4-methoxy-2,4-dimethylvaleronitrile) (V-70; $t_{1/2}$=30° C.; 1.284 g; 1% by weight of total reactants) was added and dissolved. The headspace was swept with nitrogen and the stirred solution heated. At 45° C. gas evolution was observed and heating was continued at 45–55° C. for 4 hours at which time gas evolution was completed. The crude product was then heated at about 60° C. for 1 hour, followed by vacuum stripping for 1.5 hours until all the volatile components were collected (0.8 Torr and 50–65° C.). The product, obtained as a yellow colored, low odor, liquid (101.79 g; 90% yield) was shown by spectral analysis to be the thiol-ene adduct of G4 and AGE. The $^1$H NMR spectrum indicated the absence of olefinic protons at δ=5.30 ppm ($CH_2$=CH—) and δ=5.90 ppm ($CH_2$=CH—). The IR spectrum indicated the absence of thiol group (—SH) at 2560 $cm^{-1}$ and the allylic double bond ($CH_2$=$CHCH_2O$—) at 1643 $cm^{-1}$. The epoxy equivalent weight (EEW) of this AGE/G4 product was determined to be 891 g. The viscosity of this product was measured to be 1,317 mPa·s.

The reaction products were characterized by spectral analysis and epoxide equivalent weight (EEW) and viscosity measurements. Several azonitrile initiators having different decomposition temperatures were initially examined in small-scale reactions (50–80 mL) as potential catalysts. The results of these experiments are presented in Table 1.

TABLE 1

AGE/G4 reaction product results with different azonitrile catalysts

| Catalyst | 10 hour half-life (° C.) | Reaction Temp. (° C.) | EEW | Viscosity, 25° C. (mPa · s) |
|---|---|---|---|---|
| Vazo 64 | 65 | 85 | 2,361 | 6,700 |
| V-65 | 51 | 60 | 1,400 | 1,400 |
| V-70 | 30 | 50 | 669 | 783 |

Vazo 64: 2,2'-azobis(2-methylpropanenitrile)
V-65: 2,2'-azobis(2,4-dimethylvaleronitrile)
V-70: 2,2'-azobis(4-methoxy-2,4-dimethylvaleronitrile)

Figure 2:
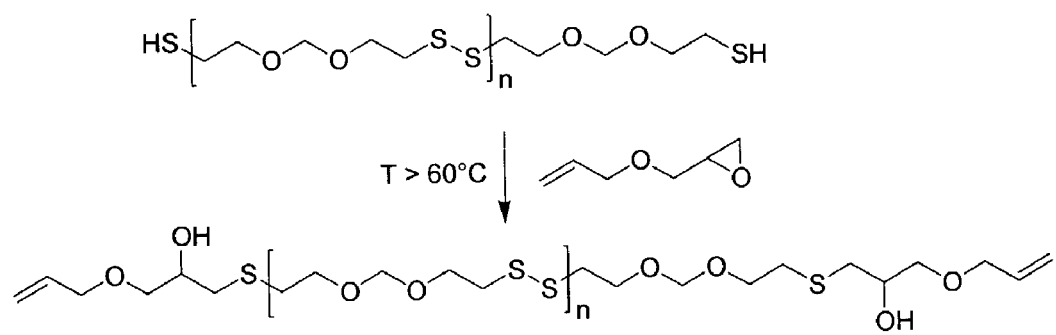
FIG. 2 illustrates the formation of allyl ether-terminated β-hydroxy thioether when the addition of AGE to thiol-terminated polysulfide is carried out at elevated temperature.

The thiol equivalent weight and viscosity of the starting polysulfide was found to be 483 g and 1030 mPa·s at 25° C. respectively (Akcros Chemical TDS reports 1300 mPa·s). The theoretical epoxide equivalent weight of the thiol-ene adduct AGE-G4 is therefore 711 [483+2(114), i.e. EW of G4+2(MW of AGE)]. This data indicates that a product having close to the theoretical value for the thiol-ene coupled adduct of FIG. 1 was only obtained when a relatively low decomposition temperature catalyst, such as V-70, was employed. Such a catalyst permits the radical reaction to proceed at a relatively low reaction temperature and ensures that the polysulfide thiol reacts almost exclusively with the olefin rather than the epoxide group. With higher temperature catalysts, such as Vazo 64 and V-65, significant increases in epoxide equivalent weight were observed. This increase can be attributed to a ring opening reaction of epoxide to give the undesirable allyl ether terminated β-hydroxy thioether (FIG. 2). In addition to lowering the degree of epoxidation, the presence of these materials are expected to increase the viscosity of the reaction mixture through H-bonding of the hydroxyl group and molecular weight increases resulting from hydroxyl-epoxide etherification reaction. Viscosity measurements confirmed this expectation (Table 1).

To determine the reproducibility of the method and to provide sufficient material for evaluation purposes, we repeated the reaction under slightly variable conditions and the results of nine runs, using stoichiometric amounts of AGE and polysulfide, are shown in Table 2.

TABLE 2

Results of repeated synthesis batches of AGE-G4 adduct using 1% by weight V-70 catalyst except as otherwise noted.

| Reaction # | Reaction Volume (L) | Reaction Conditions (° C./hours) | Yield (%) | EEW | Viscosity, 25° C. (mPa · s) |
|---|---|---|---|---|---|
| 1 | 45 | 50/2 + 60/2 | 94 | 669 | 783 |
| 2 | 90 | 60/6.5 | 92 | 764 | 1,100 |
| 3 | 45 | 45/2 + 60/4 | 91 | 728 | 817 |
| 4 | 84 | 50/2 + 60/2 | 90 | 891 | 1,317 |
| 5 | 84 | 50/3 + 60/2 | 90 | 887 | 1,125 |
| 6 | 84 | 50/3 + 60/1 | 90 | 867 | 1,120 |
| 7 | 500 | 45/3 + 50/1 | 98 | 761 | 950 |
| 8 | 500 | 45/2 + 57/2 | 92 | 751 | 950 |
| 9* | 500 | 45/2 + 58/2 | 93 | 689 | 750 |

*V-70 concentration in run #9 is 1.05% by weight.

The results show that the epoxide equivalent weight (EEW) of product is consistent and close to the theoretical value of 711 for the desired adduct. Extended reaction times or small variations in the reaction temperature do not significantly influence the final EEW or product viscosity. These results show that once the desired material is formed, it is unlikely to participate in further or secondary reactions and that catalyst residues do not have an adverse affect on the product stability. Of all of these reactions, the conditions used in run #9 provided an epoxidized product having EEW closest to the theoretical value. These conditions are, therefore, considered close to optimum for scale-up and production purposes.

The viscosity values of the thiol-AGE adducts are consistently lower than that of the starting polysulfide G4 although the molecular weights are slightly increased. This can be attributed to the replacement of terminal H-bonding thiol groups with non-H-bonding glycidoxypropyl thioether groups.

Example 2

Alternate Method for Preparation of Epoxidized Polysulfides

Figure 3:
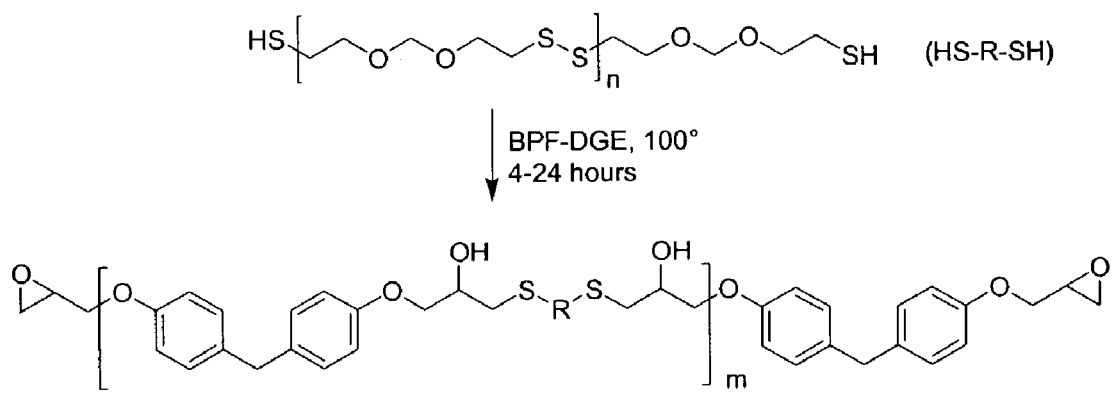
FIG. 3 illustrates the synthesis and structure of an epoxy-terminated polysulfide polymer.

An alternate method was examined for the production of epoxidized polysulfides, involving the telechelic step-growth polymerization of thiol-terminated polysulfides with excess bisphenol F diglycidyl ether (BPF-DGE). The reaction is outlined in FIG. 3. A typical procedure is as follows: Thioplast G4 polysulfide (28.982 g; 0.06 equivalents of thiol) and bisphenol F diglycidyl ether (RE-404) (30.528 g; 0.196 equivalents of epoxide) were added to a 100 mL three-necked round bottom flask fitted with a thermocouple and magnetic stirrer. The mixture was heated at 100° C. for 5 hours to give the epoxy terminated extended polymer as a viscous liquid (57.106 g; 96% yield; EEW=419 g; viscosity at 25° C.=57,000). $^1$H NMR (CDCl3): δ=3.30, m, 2H, —OCH$_2$CH— of epoxide group; IR (ATR); OH group 3476 cm−1.

Thus, the reaction was conducted by heating a neat mixture of polysulfide and excess epoxy monomer at 100° C. It was performed under a variety of conditions to provide materials having different properties. The epoxide equivalent weight and viscosity of the final extended polysulfide resin were found to depend largely of the reaction time and to a lesser extent on the stoichiometry. The results of four experiments are summarized in Table 3.

TABLE 3

Reaction of polysulfide with excess BPF-DGE at 100° C.

| BPF-DGE/G4 EW ratio | Reaction Time (hours) | Yield (%) | EEW | Viscosity, 25° C. (mPa · s) |
|---|---|---|---|---|
| 3 | 5 | 96 | 419 | 57,000 |
| 3 | 24 | 91 | 1,736 | N/A |
| 5 | 23 | 93 | 1,162 | N/A |
| 7 | 4 | 95 | 276 | 16,900 |

The relatively large BPF-DGE/G4 EW ratio ensured that a gelled product was not obtained. The structure of the products were confirmed by spectroscopic analysis.

Example 3

Preparation of Prototype Underfill Adhesive Formulations

Bisphenol F diglycidyl ether epoxy monomer (RE404; Nippon Kayaku Co.), toughening agent, Co(AcAc)$_3$ (added as 1% premix in RE404), Unilink 4100 (UOP Inc.; N,N'-bis-isobutyl-p-phenylenediamine), A-137 (OSI Specialities; octyl triethoxy silane) and silica (SO-E5; Admatechs Co) were blended together using a mechanical mixer and vacuum treated at room temperature for about 30 minutes to remove small amounts of volatile materials present in the A-137 silane. The mixture was then heated to 100° C. (to promote silylation of silica filler) and cooled to room temperature. A-1100 silane (OSI Specialties; 3-aminopropyl triethoxysilane) and imidazole catalyst (2-propylimidazole; Actiron NXJ-60; Synthron Inc) were then added and the mixture stirred for a further 10 minutes. The composition was vacuum treated to remove air bubbles and used immediately or stored at −20° C. until needed.

Fracture toughness tests were conducted on several prototype formulations containing epoxidized polysulfides AGE-G4 (EEW=669) and extended BPF-DGE/G4 as toughening agents. The formulations prepared with AGE-G4 are shown in Table 4.

TABLE 4

Formulations containing epoxidized polysulfide AGE-G4 as a toughening agent

| Component | G | H | I | J | K |
|---|---|---|---|---|---|
| AGE-G4 | 0 | 5.28 | 7.70 | 10.16 | 0 |
| G-4 | 0 | 0 | 0 | 0 | 5.20 |
| BPF-DGE | 25.24 | 22.99 | 22.31 | 20.99 | 23.87 |
| 1% Co premix | 8.78 | 8.44 | 8.22 | 8.11 | 8.32 |
| Unilink 4100 | 3.29 | 3.15 | 3.09 | 3.04 | 3.17 |
| A-137 silane | 0.39 | 0.40 | 0.37 | 0.44 | 0.42 |
| Silica, SO-E5 | 60.33 | 57.84 | 56.45 | 55.44 | 57.12 |
| A-1100 silane | 0.64 | 0.62 | 0.62 | 0.60 | 0.61 |
| 2-propyl imidazole | 1.33 | 1.28 | 1.24 | 1.22 | 1.30 |

Composition G without added rubber and composition K with unmodified polysulfide G4 were included for comparative purposes (control samples). Samples of each formulation were cured as already described and tested for fracture toughness. The results are summarized in Table 5.

TABLE 5

Fracture toughness test results for underfill adhesives containing epoxidized polysulfide AGE-G4 as toughening agents.

| Formulation | Weight % Rubber | Gq (lb/in) | Kq (MPa√m) |
|---|---|---|---|
| G | 0 | 1.40 ± 0.39 | 1.42 ± 0.18 |
| H | 5.3 | 2.05 ± 0.22 | 1.59 ± 0.12 |
| I | 7.7 | 2.42 ± 0.17 | 1.60 ± 0.12 |
| J | 10.2 | 3.46 ± 0.31 | 1.88 ± 0.15 |
| K | 5.2 | 1.90 ± 0.11 | 1.54 ± 0.08 |

Figure 4:
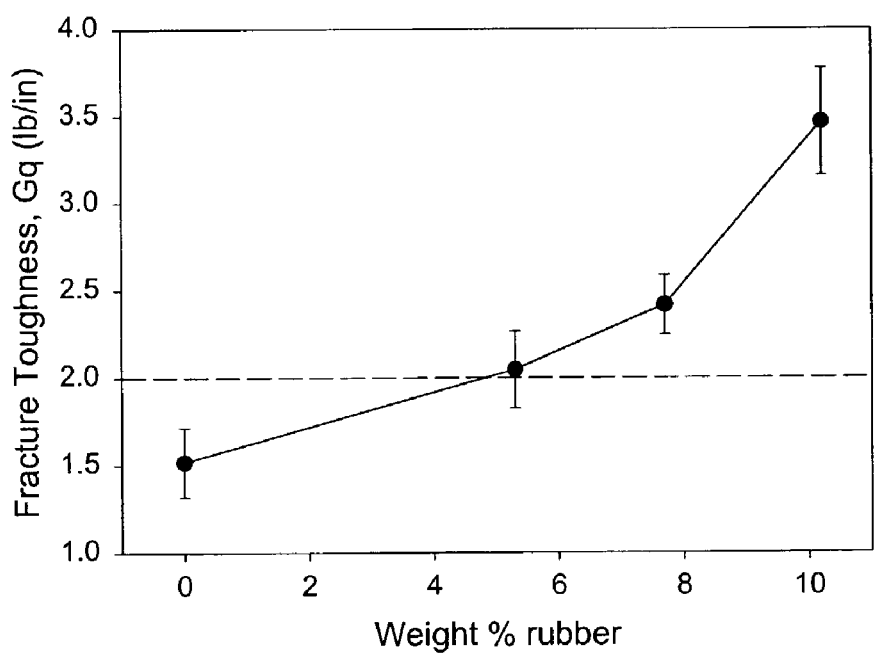
FIG. 4 illustrates the variation of Gq as a function of rubber concentration. Error bars represent the standard deviation of an average of 7 specimens. Dashed line indicates the minimum required value.

The epoxidized polysulfide, AGE-G4, enhances fracture toughness (as measured by Gq and Kq) of the underfill formulation. FIG. 4 shows the effect of increasing the concentration of the toughening agent on the value of Gq. The formulation meets the minimum required value when the rubber level reaches about 5% by weight and increases significantly thereafter.

Formulations containing extended epoxidized polysulfides prepared by the reaction of G4 with excess BPF-DGE (RE-404) were also prepared and evaluated. Details of these formulations are shown in Table 6.

TABLE 6

Formulations containing extended BPF-DGE/G4 polysulfide rubbers

| Component | L | M | N |
|---|---|---|---|
| 3/1 BPF-DGE/G4 (L) | 12.19 | 0 | 0 |
| 3/1 BPF-DGE/G4 (H) | 0 | 11.81 | 0 |
| 7/1 BPF-DGE/G4 | 0 | 0 | 19.55 |
| BPF-DGE | 18.75 | 21.43 | 12.04 |
| 1% Co premix | 8.11 | 7.83 | 8.03 |
| Unilink 4100 | 3.08 | 2.98 | 3.06 |
| A-137 silane | 0.38 | 0.36 | 0.37 |
| Silica, SO-E5 | 55.65 | 53.83 | 55.15 |
| A-1100 silane | 0.61 | 0.56 | 0.59 |
| 2-propyl imidazole | 1.23 | 1.20 | 1.21 |

Fracture toughness test results are presented in Table 7.

TABLE 7

Fracture toughness test results for underfill adhesives containing epoxy extended polysulfide BPF-DGE/G4 resins as toughening agents.

| Formulation | Weight % rubber | EEW of Rubber | BPF-DGE/G4 EEW ratio | Gq (lb/in) | Kq (MPa√m) |
|---|---|---|---|---|---|
| L | 5.94 | 419 | 3 | 2.14 ± 0.24 | 1.56 ± 0.06 |
| M | 6.00 | 1,736 | 3 | 2.87 ± 0.47 | 1.55 ± 0.05 |
| N | 6.03 | 276 | 7 | 2.74 ± 0.68 | 1.53 ± 0.15 |

At about 6% rubber loading, the fracture toughness (Gq) of the compositions containing the extended polysulfide are significantly superior to that of the control formulation G, which does not contain a toughening agent (Table 5). The results also compare favorably with that obtained for the product containing unmodified polysulfide G4 (formulation K, Table 9) and all meet the minimum specified value for Gq of 2.0 lb/in. It is expected that by increasing the amount of added BPF-DGE/G4, additional improvements in fracture toughness can be obtained.

Example 4

Capillary Flow Testing

Underfill adhesives are generally applied to component parts by capillary filling after the chip components have been assembled and aligned with the requisite conductive receptors located on the substrate. To enable reasonable production rates and to ensure component reliability the adhesive is required to fill the bondline gap quickly and completely. The underfill adhesive should flow, by capillary force, a distance of 20 mm through a 2-mil gap between a pair of microscope slides in ≦180 seconds at 120° C. The formulated products described above were tested to determine if they conformed to this specification. The results are presented in Table 8.

TABLE 8

Capillary flow results for toughened underfill formulations

| Formulation | Toughening Agent | Weight % rubber | Flow time (seconds) |
|---|---|---|---|
| H | AGE/G4 | 5.3 | 170 |
| I | AGE/G4 | 7.7 | 155 |
| J | AGE/G4 | 10.2 | 175 |
| K | G4 | 5.2 | 285 |
| L | BPF-DGE/G4 | 5.9 | 242 |
| M | BPF-DGE/G4 | 6.0 | 222 |
| N | BPF-DGE/G4 | 6.0 | 276 |

All of the formulations containing epoxidized polysulfide AGE-G4 (H, I and J) have flow times that are below the specification limit of 180 seconds. In contrast, the formulations containing G4 (K) and extended polysulfide (L, M and N) all fail to meet the flow requirements. The poor flow associated with formulation K containing unmodified polysulfide G4 can be attributed to the free thiol functional groups, which readily undergo addition reaction with the epoxy monomer as the temperature is increased. This reaction results in the premature gellation of the formulation and inhibits capillary flow. The relatively poor flow associated with the epoxy extended polysulfides is attributed to their relatively high viscosity compared to AGE-G4. The molecular weight of extended G4 is higher than that of AGE-G4 and the epoxidation reaction results in the formation of β-hydroxy thioether groups which lead to further increases in viscosity as a result of hydrogen bonding. In contrast, AGE-G4 is produced by a simple capping reaction, there is no significant increase in molecular weight and H-bonding groups are not produced.

What is claimed is:

1. An epoxidized polysulfide liquid rubber having an epoxy equivalent weight in the range of about 300 up to about 7000, and a viscosity at 25° C. in the range of about 300 up to about 30,000 milliPascal-seconds; wherein said epoxidized polysulfide liquid rubber is prepared by subjecting a mixture of a thiol-terminated polysulfide liquid rubber, an alkenyl- or alkynyl-functional epoxy monomer, and a free radical catalyst to a temperature of no greater than about 60° C. for a time in the range of about 1 up to about 24 hours.

2. An adhesive formulation comprising:
   a curable epoxy resin,
   a curing agent,
   at least one toughening agent comprising an epoxidized polysulfide liquid rubber having an epoxy equivalent weight in the range of about 300 up to about 7000, and a viscosity at 25° C. in the range of about 300 up to about 30,000 milliPascal-seconds; wherein said epoxidized polysulfide liquid rubber is prepared by subjecting a mixture of a thiol-terminated polysulfide liquid rubber, an alkenyl- or alkynyl-functional epoxy monomer, and a free radical catalyst to a temperature of no greater than about 60° C. for a time in the range of about 1 up to about 24 hours; and optionally, a filler.

3. The adhesive formulation of claim 2 wherein said curing agent is selected from the group consisting of anhydrides, amines, imidazoles, amides, thiols, carboxylic acids, phenols, dicyandiamide, urea, hydrazine, hydrazide, amino-formaldehyde resins, melamine-formaldehyde resins, amine-boron trihalide complexes, quaternary ammonium salts, quaternary phosphonium salts, tri-aryl sulfonium salts, di-aryl iodonium salts, diazonium salts, and combinations of any two or more thereof.

4. A method for adhesively attaching a device to a substrate, the method comprising dispensing an adhesive formulation according to claim 2 onto a substrate and/or a device or between the substrate and the device to form an assembly, and exposing the assembly to conditions sufficient to cure the adhesive.

5. An assembly produced by the method of claim 4.

6. A method for adhesively attaching a first article to a second article, the method comprising:

(a) applying a formulation according to claim 2 to the first article, (b) bringing the first article and the second article into intimate contact to form an assembly wherein the first article and the second article are separated only by the adhesive formulation applied in step (a), and thereafter, (c) subjecting the assembly to conditions suitable to cure the adhesive formulation.

7. An assembly produced by the method of claim 6.

8. A method for encapsulating an electronic component, the method comprising:

applying a formulation according to claim 2 to the component, and curing the formulation.

9. An article prepared according to the method of claim 8.

10. A method for encapsulating an electronic component, the method comprising curing a formulation according to claim 2 after application of the composition to the component.

11. An article prepared according to the method of claim 10.

12. An article comprising an electronic component adhesively attached to a circuit board, wherein the electronic component is adhesively attached to the board by a cured aliquot of a formulation according to claim 2.

13. A cured aliquot of a formulation according to claim 2.

* * * * *